(12) United States Patent
Nadeau-Dostie et al.

(10) Patent No.: US 6,763,489 B2
(45) Date of Patent: Jul. 13, 2004

(54) METHOD FOR SCAN TESTING OF DIGITAL CIRCUIT, DIGITAL CIRCUIT FOR USE THEREWITH AND PROGRAM PRODUCT FOR INCORPORATING TEST METHODOLOGY INTO CIRCUIT DESCRIPTION

(75) Inventors: Benoit Nadeau-Dostie, Aylmer (CA); Jean-François Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 661 days.

(21) Appl. No.: 09/773,541

(22) Filed: Feb. 2, 2001

(65) Prior Publication Data

US 2002/0147951 A1 Oct. 10, 2002

(51) Int. Cl.[7] .............................................. G01R 31/28
(52) U.S. Cl. ....................................... 714/731; 713/500
(58) Field of Search .................... 326/16; 714/726–731; 713/500

(56) References Cited

U.S. PATENT DOCUMENTS

| | | |
|---|---|---|
| 4,503,537 A | 3/1985 | McAnney |
| 5,329,533 A | 7/1994 | Lin |
| 5,349,587 A | 9/1994 | Nadeau-Dostie et al. |
| 5,519,714 A | 5/1996 | Nakamura et al. |
| 5,533,032 A | 7/1996 | Johnson |
| 5,614,838 A | 3/1997 | Jaber et al. |
| 5,627,841 A | 5/1997 | Nakamura |
| 6,115,827 A | 9/2000 | Nadeau-Dostie et al. |
| 6,145,105 A | 11/2000 | Nadeau-Dostie et al. |

OTHER PUBLICATIONS

Silberman, J. et al. "A 1.0–GHz single–issue 64–bit powerPC integer processor;" IEEE Journal of Solid–State Circuits; Nov. 199 On pp. 1600–1608, vol.: 33, Issue: 11.*

McLaurin, T.L. et al. "The testability features of the MCF5407 containing the 4th generation ColdFire(R) microprocessor core;" International Test ConferenceProceedings, Oct. 3–5, 2000; On pp.: 151–159.*

Kee Sup Kim and Len Schultz, Multi–Frequency, Multi–Phase Scan Chain, International Test Conference, 1994, pp. 323–330.

* cited by examiner

*Primary Examiner*—Guy J. Lamarre
(74) *Attorney, Agent, or Firm*—Eugene E. Proulx

(57) ABSTRACT

A method for at-speed scan testing of circuits having scannable memory elements which source multi-cycle paths having propagation delays that are longer than the period of a system clock used during normal operation comprises loading a test stimulus into the scannable memory elements; performing a capture operation, including configuring in capture mode throughout the capture operation, non-source memory elements and multi-cycle path source memory elements which have a predetermined maximum capture clock rate which is the same as or higher than the clock rate of the capture clock; and configuring in a hold mode during all but the last cycle of the capture operation and in capture mode for the last cycle, source memory elements which have a predetermined maximum capture clock rate which is lower than the clock rate of the capture clock; applying at least two clock cycles of the capture clock; and unloading test response data captured by said scannable memory elements.

65 Claims, 7 Drawing Sheets

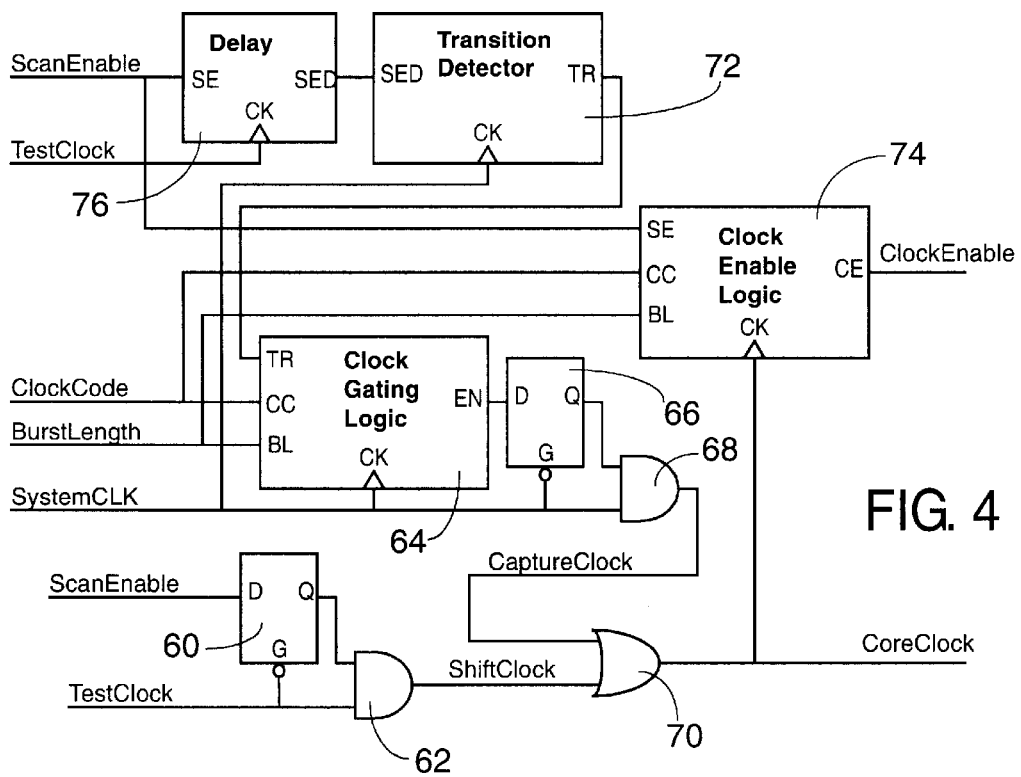
FIG. 4
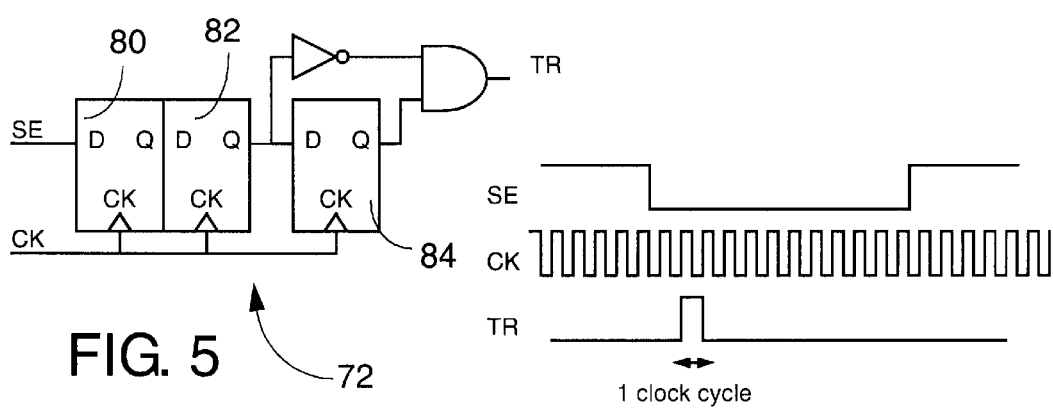
FIG. 5
FIG. 6 though the scan enable signal can be pipelined, as
METHOD FOR SCAN TESTING OF DIGITAL CIRCUIT, DIGITAL CIRCUIT FOR USE THEREWITH AND PROGRAM PRODUCT FOR INCORPORATING TEST METHODOLOGY INTO CIRCUIT DESCRIPTION The present invention relates, in general, to the testing of circuits, and, more specifically to the testing of very large and/or very fast integrated circuits and to circuits adapted for use with the method.

BACKGROUND OF THE INVENTION

Multi-cycle paths have been and continue to be perceived as a fundamental problem for Built-In Self-Test (BIST) because most BIST schemes cannot handle multi-cycle paths. A multi-cycle path is a timing path through a combinational circuit that requires more than one clock period to traverse. Multi-cycle paths can be deliberate or accidental. In the design of certain types of functionality, it is useful to intentionally incorporate multi-cycle paths into a chip design. For example, synchronous counters which utilize multi-cycle paths can run at a higher frequency compared to counters constructed with the same technology but without multi-cycle paths. An accidental multi-cycle path is similar to a deliberate multi-cycle path except that the designer is usually not aware of multi-cycle paths without running static timing analysis. An example of an accidental multi-cycle path is a mode signal transmitted from one module to another. If the chip is not required to function correctly on the clock cycle immediately after the mode signal has been changed, the designer might not have simulated this mode transition and realized that the path is a multi-cycle path.

In typical scan testing schemes, pseudo-random test patterns are loaded or shifted into scannable memory elements. The output response of the circuit is captured in the memory elements, shifted out of the elements and compacted into what is referred to as a "signature". The signature is compared to a reference signature, on chip or in an external tester, and a pass/fail test result is obtained. When the test stimulus is applied, it is expected that all data will traverse all logic paths and meet flip-flop setup time requirements of the capture clock during the period(s) where an at-speed test is performed, i.e., the test stimulus is launched from memory elements consequent to a first active clock edge and the output response is captured consequent to a second active clock edge, the time period between the clock edges being substantially the same as that used during the normal operation of the circuit. This requirement cannot always be satisfied for multi-cycle paths. The signature obtained from circuits having multi-cycle paths is dependent on the test frequency used to perform the test. If the clock rate of the test clock is sufficiently low, the correct signature is always obtained in a properly functioning circuit because the slow clock rate allows sufficient time for the output of the memory elements which source multi-cycle paths to settle before the capture cycle. However, a different signature may be obtained when a higher test clock rate is used. Clearly, frequency-dependent variation in the test response of a circuit is unacceptable. Useful tests require testing the circuit at the normal operation clock rate of the circuit. It is when attempts are made to test a circuit at-speed, i.e. at the speed for which the circuit was designed to operate during normal operation, that problems arise.

Nadeau-Dostie et al U.S. Pat. No. 6,145,105 granted on Nov. 7, 2000 for "Method and Apparatus for Scan Testing Digital Circuits", which is incorporated herein by reference, proposes a method by which both shift and capture operations are performed at-speed. Memory elements which source multi-cycle paths are arranged in separate scan chains with other memory elements with the same output propagation delay. The test is performed at-speed. All memory elements that source values into multi-cycle paths are made to shift at a slower frequency, which means that they are stable for a number of clock cycles, corresponding to the propagation delay in the path, before the capture edge. The multi-cycle path source memory elements are provided with an extra 2-to-1 multiplexer, which allows shifting at a lower frequency without affecting its clock connection. By reducing the shift rate, the time from the last shift clock to the capture clock is increased relative to that of a higher shifting rate, providing enough time for multi-cycle paths to settle before the capture edge of the capture cycle. The method provides consistent signatures at different test clock rates. However, the scan enable signal, which configures scannable memory elements in shift and capture modes, becomes a timing critical signal which must be distributed to all scannable memory elements within one system clock cycle. Even though the scan enable signal can be pipelined, as shown in Nadeau-Dostie et al, there might still be difficulty distributing the signal in time in very large and/or very fast circuits. For such circuits, an alternative method is required.

SUMMARY OF THE INVENTION

The present invention seeks to provide an improved scan testing method which can be used in circuits having multi-cycle paths with various propagation delays, and in very large and/or very fast circuits in addition to conventional circuits. In the present invention, the state of memory elements which source multi-cycle paths is controlled independently of non-source memory elements during capture operations so that, depending on the clock rate used during capture operations and the propagation delay through the combinational logic in its output, source memory elements are either configured in capture mode throughout the capture operation or in hold mode for all but the last cycle of the capture operation when it is configured in capture mode.

In accordance with one aspect of the present invention, there is provided a method for at-speed testing of a circuit having combinational logic and scannable memory elements connected to the combinational logic, with one or more of the memory elements being a source of a multi-cycle signal path having a propagation delay that is longer than the period of a system clock applied to the elements during normal operation of the circuit, each source memory element having a predetermined maximum capture clock rate, corresponding to a minimum capture clock period, within which the output of a source element can traverse the signal path within one cycle of the capture clock, the scannable memory elements being configurable in shift mode and capture mode, the source memory elements being additionally configurable in hold mode, the scannable memory elements being clocked by a common clock signal, the method comprising loading a test stimulus into the scannable memory elements; performing a capture operation including configuring in capture mode throughout the capture operation non-source memory elements and source memory elements having a predetermined maximum capture clock rate which is the same as or higher than the clock rate of a capture clock; and configuring in a hold mode during all but the last cycle of the capture clock and in capture mode for the last cycle thereof, source memory elements having a predetermined capture clock rate which is lower than the clock rate of the capture clock; applying at least two clock cycles of the capture clock; and unloading test response data captured by the scannable memory elements.

Controlling source memory elements in this manner during the capture operation ensures that the outputs of the source memory elements reach their respective destinations prior to the capture cycle, including when the test is performed at speed, and thus ensures that the signatures obtained are independent of the clock rate used to perform a test. A further aspect of the method of the present invention involves specifying a clock code indicating a desired capture clock rate and a burst length code indicating the number of clock cycles to be provided during the capture operation.

In accordance with another aspect of the invention, there is provided a test controller for use in at-speed scan testing of a circuit having combinational logic and scannable memory elements including memory elements which source multi-cycle signal paths having propagation delays that are longer than the period of a system clock used during normal operation of the circuit, each source memory element having a predetermined maximum capture clock rate within which the output thereof can traverse the signal path within one cycle of an input clock, the scannable memory elements being configurable in shift mode and capture mode, the source memory elements being configurable in shift mode, capture mode and hold mode, the test controller comprising a clock generating circuit for generating a common clock signal for the scannable memory elements, the clock generating circuit providing a shift clock rate during test stimulus loading and test response unloading operations; and a capture clock rate derived from a system clock during capture operations; and a source memory element control circuit for configuring in capture mode throughout a capture operation source memory elements having a predetermined maximum capture clock rate which is the same as or higher than the desired capture clock rate; and configuring in a hold mode during all but the last cycle of the capture operation and in capture mode for the last cycle thereof, source memory elements having a predetermined capture clock rate which is lower than the desired capture clock rate.

As is known in the art, integrated circuit devices are typically designed and fabricated using one or more computer data files, referred to herein as hardware definition programs or circuit description, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of fully functioning integrated circuit devices and data processing systems utilizing such devices, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links. Another aspect of the present invention relates to a software tool or program product for modifying an existing circuit description so as to incorporate into it scan testing capability according to the present invention.

In accordance with still a further aspect of the present invention, there is provided a method and program product for modifying a circuit description so as to adapt the circuit for at-speed testing, the circuit having combinational logic and scannable memory elements, including scannable memory elements having an output which is a source of a multi-cycle signal path having a propagation delay that is longer than the period of a system clock used during normal operation, the scannable memory elements having a clock input used during both the functional mode of operation and a shift mode of operation, the method comprising reading a circuit description of the circuit having a description of each scannable memory element; inspecting the description of each scannable memory element and determining the propagation delay of the output of the scannable memory element, and, when the propagation delay is greater than one cycle, arranging the scannable memory element in a multi-cycle path group of scannable memory elements having the same propagation delay to receive the same control signal; and revising the description of the scannable memory element by adding a hold mode defined by a control signal; inserting into the circuit description, a description of a test controller for performing at-speed testing of the circuit, including: inserting a description of a clock generating circuit for generating a common clock signal applied to the clock input of the memory elements during testing of the circuit, in which the common clock signal comprises shift clock signal derived from a test clock signal, a capture clock signal derived from a system clock signal in which the number of cycles of the capture clock is determined from a combination of a burst length signal and the capture clock rate is determined from a clock code signal; and inserting a description of a clock enabling circuit for generating a group clock enable signal for each multi-cycle group of scannable memory elements; and storing the revised description of the circuit.

BRIEF DESCRIPTION OF THE DRAWINGS

These and other features of the invention will become more apparent from the following description in which reference is made to the appended drawings in which:

FIG. 4 is a circuit diagram of a clock and clock enable generation circuit according to one embodiment of the present invention;

FIG. 5 illustrates a prior art transition detector which may be used in the circuit of FIG. 4;

FIG. 6 is a timing diagram for the prior art transition detector of FIG. 5;

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention. Reference is made to active or inactive signals or nodes. When a signal or node is referred to as inactive, the term is intended to mean the same as a signal or node which is low, at logical zero or in a low state. When a signal or node is active, the term is intended to mean the same as a signal or node which is a logical one, high or in a high state.

While the present invention is particularly concerned with built-in self-test of scannable circuits, it will be understood by those skilled in this art that the method described and claimed herein is equally applicable to testing of circuits using scan patterns stored on a tester.

Figure 1:
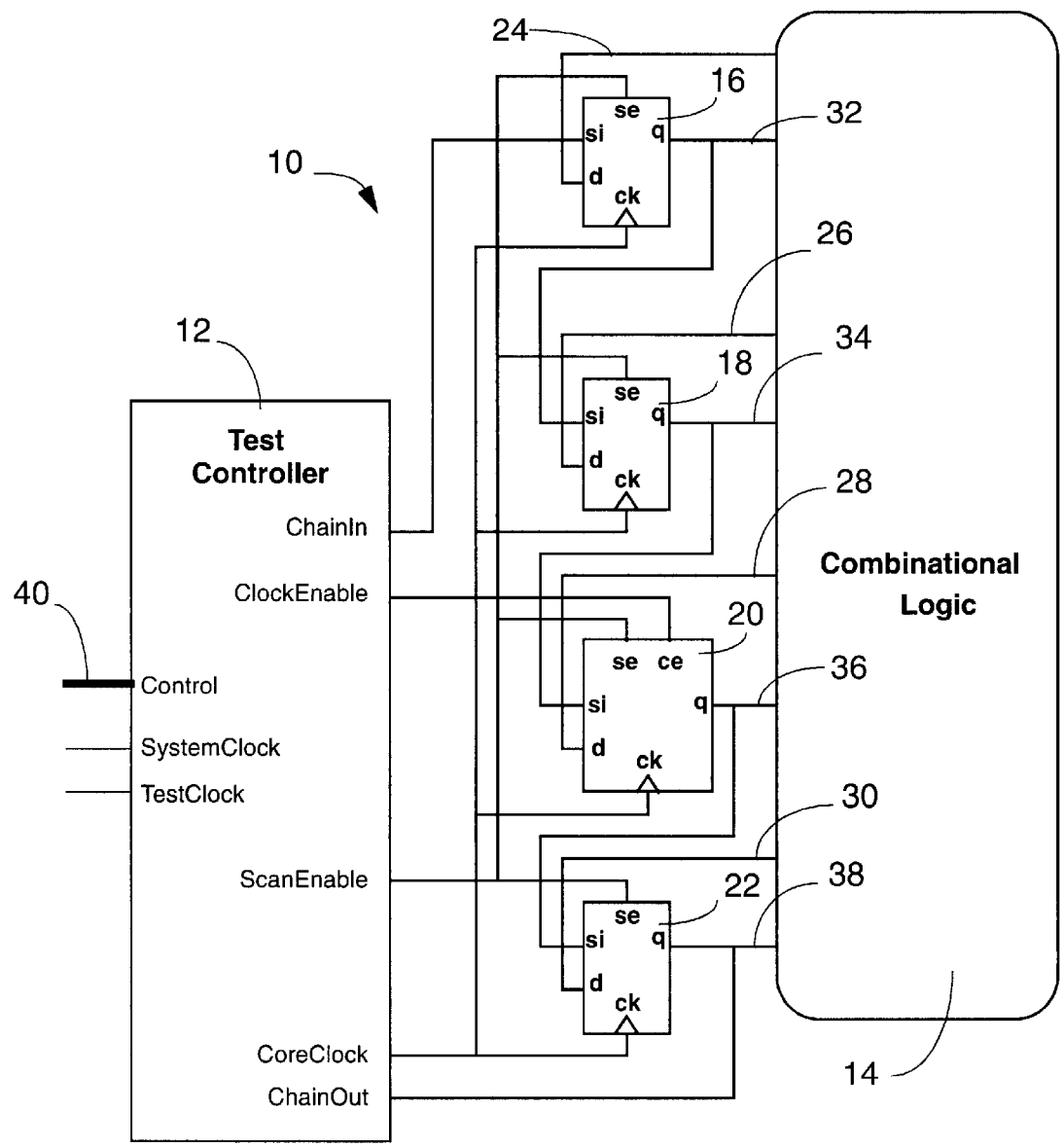
FIG. 1 is shows a circuit having combinational logic, scannable memory elements including a memory element, which is the source of a multi-cycle path, and a test controller according to the present invention.

FIG. 1 illustrates a very simple circuit 10 to illustrate the principles of the present invention. Circuit 10 comprises a test controller 12, combinational logic 14 and scannable memory elements 16, 18, 20, and 22. As described below, memory element 20 is the source of a multi-cycle path of two, i.e. its output requires two clock cycles to propagate to the input of its destination memory element. In prior art scan testing methods, the maximum speed at which the circuit could be tested is one-half of the design or system clock speed of the circuit. The present invention provides a method of testing such a circuit at any clock speed, including at the system clock speed and obtain valid signatures for a properly functioning circuit.

In circuit 10, all scannable memory elements have a clock input port CK, a Data Input port D and an output port Q. These inputs and output are necessary to perform a circuit function during normal operation. Data input ports receive outputs 24, 26, 28 and 30 from combinational circuit 14 and output ports provide data to inputs 32, 34, 36 and 38 of the combinational logic circuit. The scannable memory elements have additional inputs for connecting the elements in scan chains. A Scan Enable port SE configures memory elements in a shift mode when active and in capture mode when inactive. A Scan Input port, SI, receives scan data when the memory element is configured in a shift mode. In FIG. 1, output port Q is used to transfer the scan data to the Scan Input port of the next memory element in the scan chain. A dedicated Scan Output port, SO, could also be used without having to modify the proposed method. The clock input, CK, of the memory elements is connected to a CoreClock output of the test controller, which output provides a common clock signal for all of the memory elements. For purposes of illustration, it is assumed that the memory elements are responsive to the rising edge of the input clock. That is, data is transferred from D to Q when CK rises and SE is low and from SI to Q when CK rises and SE is high. However, the active polarities could be different. The Scan Enable signal, SE, is provided by the ScanEnable output of test controller 12.

The serial data input SI of the first memory element 16 is connected to an output port, ChainIn, of the test controller. The serial data output of the last memory element 22 is connected to an input port, ChainOut, of the test controller. More than one scan chain is typically used in a real circuit, but only one scan chain is shown to simplify the schematic.

For illustration purposes, the propagation delay of in the signal path of the outputs of memory elements 16, 18 and 22 is one clock cycle. There elements are referred to as single-cycle path or non-source memory elements. Scannable memory element 20 is the source of a multi-cycle path of two cycles. A multi-cycle path is a signal path originating at the output of a memory element and ending at the input of a memory element and having a propagation delay which is longer than the period of the system clock applied to its clock input during normal operation. Memory elements which are the source of multi-cycle paths are referred to herein as "source memory elements". The propagation delay of multi-cycle signal paths is expressed in terms of an integer number of clock cycles. Thus, in the simple circuit illustrated herein, the output of memory element 20 requires two clock cycles to propagate to its destination. As mentioned earlier, in the design of certain types of functionality, it is advantageous to incorporate multi-cycle paths into a chip design. For example, synchronous counters utilizing multi-cycle paths can run at a higher frequency compared to counters constructed with the same technology but without multi-cycle paths. For any multi-cycle signal path, there is a maximum clock rate at which a capture operation can be performed and still provide enough time for multi-cycle path signals to settle before each capture edge of the capture cycle(s). The maximum clock rate is inversely proportional to the propagation delay in the path. Thus, for a propagation delay of two, the maximum clock rate is one-half of the system clock rate; for a propagation delay of four, the maximum clock rate is one-quarter of the system clock rate.

Figure 3:
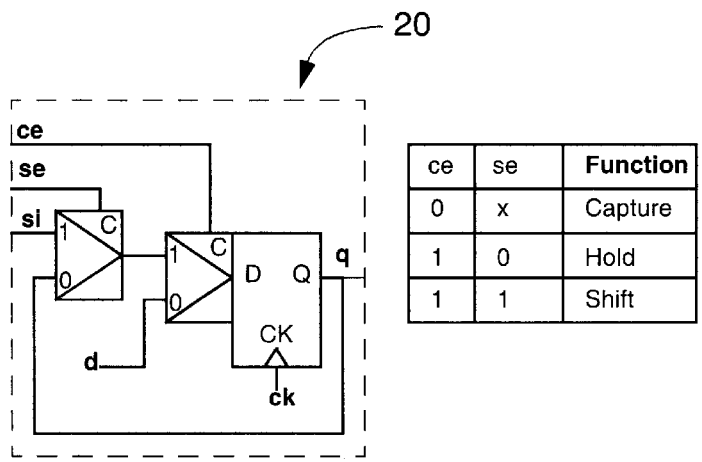
FIG. 3 is a circuit diagram illustrating a prior art scannable memory element which can be configured in shift, hold and capture mode.

In the present invention, source scannable memory elements, i.e. memory elements which are the source of a multi-cycle path, are replaced by scannable memory elements which include a hold mode, as shown FIG. 3. The addition of a hold mode to the memory element requires a control signal, called ClockEnable herein, and shown as CE in the drawings. The ClockEnable signal is active during test stimulus loading and response data unloading operations. During capture operations, when ScanEnable is inactive, source memory elements can be configured in hold mode or capture mode depending on whether the capture clock rate used to perform a test is more or less than the predetermined maximum capture clock rate of the source memory element. For the particular type of source memory element illustrated, ClockEnable is made active to configure the memory element in hold mode and inactive to configure the memory element in capture mode.

The ClockEnable signal can be shared by several memory elements which are the source of multi-cycle paths having the same propagation delay. Several ClockEnable signals are required when a circuit contains several source memory elements with different output signal propagation delays. In the simple circuit illustrated herein, only one ClockEnable signal is shown because only one source memory element is illustrated. However, in a more general case, clock enable signals would be required for multi-cycle signal paths with propagation delay of 2, 3, 4 or more clock cycles.

Test controller 12 receives two input clocks including a system clock, labeled SystemClock, and a test clock, labeled TestClock. Typically, the system clock will have a higher frequency, or clock rate, than that of the test clock, but not necessarily so. The system clock can be a free-running clock generated by circuitry which may be located inside the circuit under test, on a circuit board used to interface with a circuit tester or by a circuit tester. The test clock can be derived from the system clock and/or can be asynchronous with respect to the system clock. Test controller control port 40 is a collection of inputs and outputs used to initialize, start and stop the controller as well as to inspect the result of a test. These inputs and outputs are not discussed in more detail in this application as there are several ways to implement the controller, well known in the art, and these inputs and outputs are not critical to the present invention.

Figure 2:
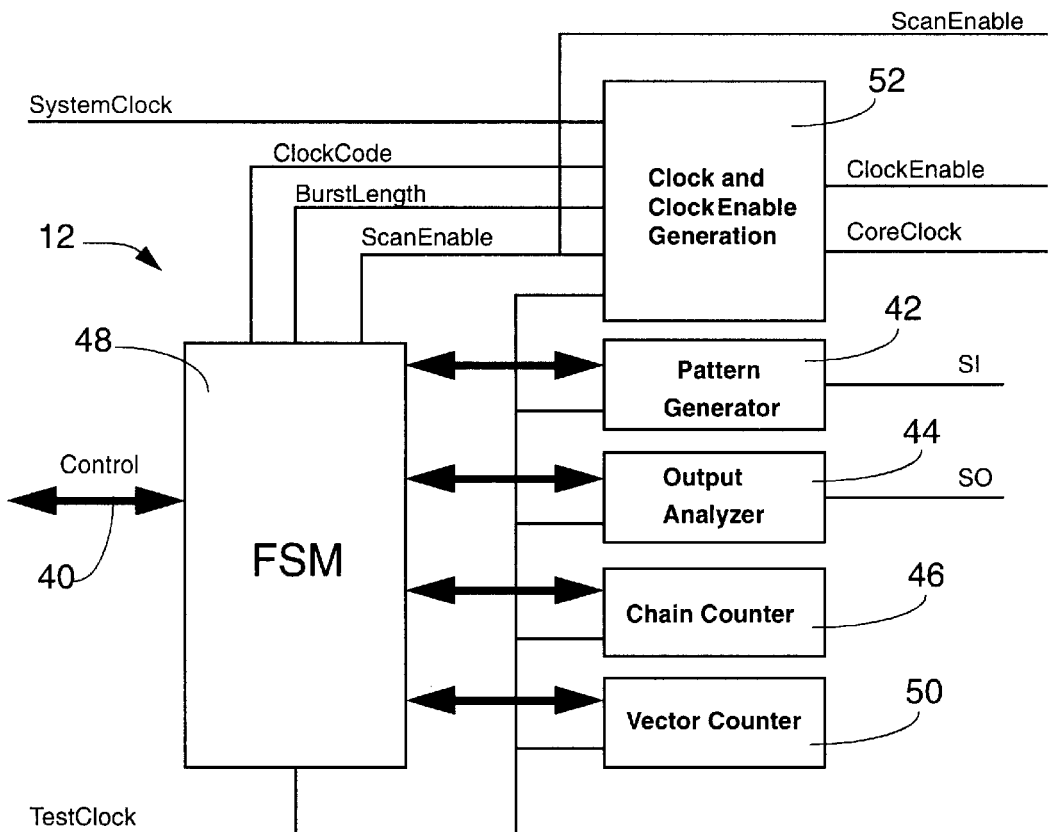
FIG. 2 is block diagram illustration of a test controller according to one embodiment of the present invention.

FIG. 2 is a more detailed block diagram view of test controller 12. The test controller is comprised of several blocks. Pattern Generator 42 generates a test stimulus (or test pattern) which is shifted, one bit at a time, through the scan chain. Output Analysis block 44 receives the circuit response to the test stimulus, one bit at a time, and typically reduces the response to a "signature". Chain Counter 46 keeps track of the number of bits that have been shifted for a given test stimulus and indicates to Finite State Machine (FSM) 48 when all bits have been shifted in. Vector Counter 50 keeps track of the number of test stimuli applied to the circuit and indicates to FSM 48 when all stimuli have been applied. All of these blocks are well known in the art and are not discussed any further in this application. FSM 48 coordinates the action of all blocks. In addition to the ScanEnable signal, the FSM generates, in accordance with the present invention, a capture clock code signal, ClockCode, and a capture clock burst length signal, BurstLength, when desired.

ClockCode is a signal which indicates the desired capture clock rate to be used for the current test stimulus. A ClockCode of 1 represents a capture clock rate which is equal to the system clock rate. A ClockCode of 2 represents a capture clock rate equal to the system clock rate divided by 2, and so forth. A test designer uses the ClockCode to specify a desired capture clock rate. The test controller responds to a specified ClockCode by generating a corresponding desired capture clock rate and generates source memory elements control signals for configuring source memory elements in an appropriate mode during capture operations, as explained later. Each source memory element is associated with a ClockCode which represents the maximum capture clock rate of the memory element.

BurstLength is a signal which specifies the number of capture clock cycles to be applied at the capture clock rate indicated by ClockCode. BurstLength also takes integer values of 1, 2, 3 and so forth. As with ClockCode, a test designer uses the BurstLength to specify a desired number of capture clock cycles to execute during a capture operation and the test controller responds to a specified BurstLength by generating the corresponding number of capture clock cycles during a capture operation and responds to combinations of a specified ClockCode and BurstLength values by generating the source memory element control signal, ClockEnable. It is to be understood that the test controller could be designed with predetermined and fixed ClockCode and/or BurstLength values without departing from the spirit of the invention.

A Clock and Clock Enable Generating block 52 receives, at respective inputs, ClockCode, BurstLength, ScanEnable, SystemClock and TestClock and outputs ClockEnable and CoreClock. The operation of block 52 is explained in more detail in the description of FIG. 4.

In a second embodiment, the test controller is comprised of only the clock and clock enable generation module 52. This second embodiment is useful if, for example, the size of a full test controller is deemed to be too large. In this second embodiment, ClockCode, BurstLength, ScanEnable and serial input to the scan chain are inputs provided by a tester to the circuit under test. Also, the serial output of the scan chains are output to an input of the tester. As will be seen, none of the new circuit inputs and outputs provided by the present invention is timing critical. All circuitry generating the two timing critical signals, CoreClock and ClockEnable, remains on the circuit to avoid having to deal with complex interface circuitry with the tester.

A third embodiment, which is particularly useful for diagnostic purposes, consists of combining the first two embodiments. That is, a complete test controller as illustrated in FIG. 2, is added to the circuit but the controller is adapted to be configured in a first mode in which only the clock and clock enable generation module is used and controlled from the tester, and in a second mode in which the controller operates in accordance with the first embodiment described above.

In general, clock and clock enable generation module 52 generates the common clock signal, CoreClock, applied to the memory elements and the one or more clock enable signals which control the state of source memory elements during a capture operation. During shift operations, the clock rate of the common clock signal is derived from the test clock. During capture operations, the clock rate of the common clock signal is derived from the system clock in accordance with the ClockCode specified for the test and the number of capture clock cycles generated corresponds to the BurstLength value specified for the test.

FIG. 4 illustrates an embodiment of the clock and clock enable generation module 52 which supports the method of the present invention. CoreClock is a common clock signal applied to all scannable memory elements and has two potential sources, namely, a capture clock, CaptureClock, and a shift clock, ShiftClock. The two clocks are exclusive, i.e., the shift clock and capture clock are never active at the same time. The shift clock is generated simply by gating the test clock with the scan enable signal by means of a latch 60 and an AND gate 62. The latch guarantees a race-free operation so that glitches are not generated on the shift clock signal. Clearly, the shift clock is active when ScanEnable is active, which is during loading and unloading operations, and inactive when ScanEnable is inactive, which is during capture operations. CaptureClock is active only during capture operations.

The capture clock is generated by gating the system clock with a pulse enable output, EN, of a clock gating logic sub-block 64 by means of a timing latch 66 and an AND gate 68. CaptureClock and ShiftClock are applied to respective inputs of an OR gate 70 which outputs CoreClock. Clock gating logic circuit 64 is clocked by SystemClock and receives, at respective inputs, ClockCode, clock BurstLength signal, and the output, TR, of a transition detector 72.

The ClockEnable signal is generated by clock enable circuit sub-block 74 described in detail later with reference to FIG. 8. ClockEnable generating circuit 74 receives, at respective inputs, the ClockCode, BurstLength and ScanEnable signals and is clocked by CoreClock.

Transition detector circuit 72 detects a falling transition on a delayed version of the ScanEnable signal. The ScanEnable control signal is delayed using delay memory elements 76 whose clock input is the TestClock signal. Memory elements 76 can update in response to the rising or falling edge of the clock signal. It is therefore possible to delay the ScanEnable control signal half clock cycle increments, i.e., by ½, 1, 1½, etc., clock cycles. The delay is chosen such that the capture clock burst, derived from the system clock signal, becomes active after the data has had sufficient time to propagate from source scannable memory elements to all of their destination or recipient memory elements and some time before the response data unloading shift sequence starts. In the simple example illustrated, one memory element 76 is provided to delay ScanEnable by one-half of a clock cycle of the test clock. The delay must take into account the delay introduced by the transition detector and clock gating logic which is clocked by the system clock signal.

FIG. 5 illustrates a known transition detector which is suitable for the purposes of the present invention. Since TestClock and SystemClock can be asynchronous to each other, the delayed ScanEnable signal, SED, generated using TestClock must be synchronized with the SystemClock. This is achieved by sampling the delayed ScanEnable signal using memory elements 80, 82, and 84, connected in series. Usually, two memory elements are sufficient to guarantee that the delayed signal is well synchronized and that the circuit will not enter into a metastable state. This method of synchronizing is well known in the art. The transition detector generates output signal, TR. An active value of this signal indicates that a falling transition has been detected and that a test stimulus loading operation has completed. A single pulse whose duration is the same as a system clock period is generated as shown in timing diagram of FIG. 6.

Figure 7:
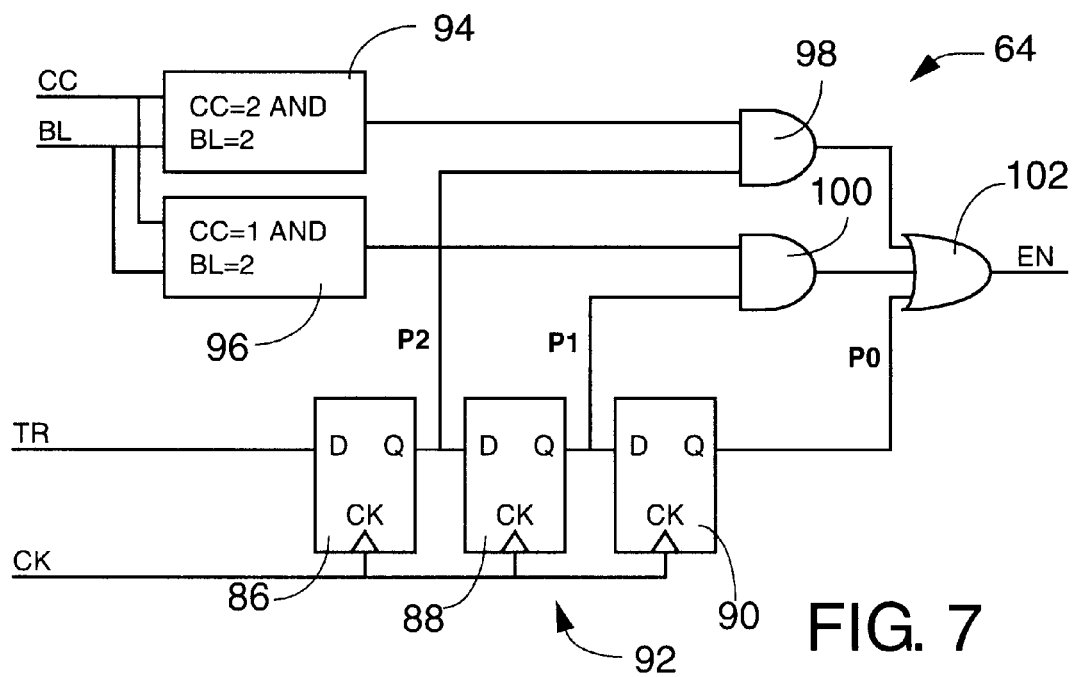
FIG. 7 illustrates a clock gating circuit which may be used in the circuit of FIG. 4, according to one embodiment of the present invention.

FIG. 7 illustrates an embodiment of a clock gating logic block 64. Block 64 is comprised of a plurality of shift register elements connected in series to form a shift register 92. The number of memory elements, SRLength, in the shift register is a function of a maximum burst length, $BL_{max}$, and a maximum clock code, $CC_{max}$, to be supported by the circuit and is given by:

$$SRLength = 1 + (BL_{max} - 1)(CC_{max}) \quad (1)$$

In FIG. 7, $BL_{max}$ is assumed to be 2 and $CC_{max}$ to be 2. Equation (1) evaluates to 3. This means that the illustrated circuit cannot support a capture clock burst greater than two clock cycles and a ClockCode greater than 2. Thus, it will be seen that shift register 92 comprises three shift register elements 86, 88 and 90. The outputs of shift register elements 86, 88 and 90 are labeled P2, P1, P0, respectively. The input to first shift register element, 86, is the output pulse, TR, of the transition detector. The outputs of the shift register elements are inactive whenever TR is inactive. When TR becomes active, the active value propagates to each shift register element with each clock cycle of SystemClock.

Block 64 further includes gating function circuits 94 and 96, which receive the ClockCode and BurstLength signals, labeled CC and BL, respectively. Except for the last, each of the shift register elements is provided with an associated gating function circuit. The output of gating function circuit 94 and output P2 of associated shift register element 86 are coupled to respective inputs of AND gate 98. The output of gating function circuit 96 and output P1 of its associated shift register element 88 are coupled to respective inputs of AND gate 100. P0 and the output of AND gates 98 and 100 are coupled to respective inputs of OR gate 102. The output of OR gate 102 is pulse enable signal, EN. P0 corresponds to the last cycle of a capture operation and is always active because each capture operation requires at least one capture cycle.

Each output P2, P1, P0 enables one pulse of a group of SRLength consecutive pulses of the system clock according to the gating functions described in TABLE I. "Pulse No." in TABLE I, corresponds to the outputs of the shift register elements of shift register 92. A pulse is enabled whenever the corresponding gating function in the second column is True. A gating function value of 1 means that the corresponding pulse is always enabled. This is the case for pulse P0 because, as mentioned, there will always be at least one capture clock pulse in order to perform a capture operation. A gating function value of 0 means that the corresponding pulse is never enabled because the capture clock burst should normally consist of equally spaced clock pulses. This is the case for pulses P5, P7, P10, P11. TABLE I includes all gating functions necessary to implement all combinations of ClockCode and BurstLength varying from 1 to 4. Additional gating functions for ClockCode and BurstLength combinations outside the specified ranges can be derived easily by a person skilled in the art.

TABLE I

CLOCK GATING FUNCTIONS

| Pulse No. | Gating Function |
|---|---|
| P0 | 1 |
| P1 | CC = 1 AND BL > 1 |
| P2 | (CC = 2 AND BL > 1) OR (CC = 1 AND BL > 2) |
| P3 | (CC = 3 AND BL > 1) OR (CC = 1 AND BL > 3) |
| P4 | (CC = 4 AND BL > 1) OR (CC = 2 AND BL > 2) |
| P5 | 0 |
| P6 | (CC = 3 AND BL > 2) OR (CC = 2 AND BL > 3) |
| P7 | 0 |
| P8 | (CC = 4 AND BL > 2) |
| P9 | (CC = 3 AND BL > 3) |
| P10 | 0 |
| P11 | 0 |
| P12 | (CC = 4 AND BL > 3) |

In the simple example of FIG. 7, only the first three rows of the table are required since ClockCode and BurstLength only vary from 1 to 2. The specific gating logic shown in FIG. 7 is a modified version of the logic in TABLE I and specifically adapted for this example:

CC=2 AND BL=2 for pulse P2;
CC=1 AND BL=2 for pulse P1; and
1 for pulse P0.

The output of logic circuit 94 is active only when the specified ClockCode and BurstLength are 2. This will cause a capture pulse corresponding to P2 to be generated when P2 becomes active. Otherwise, no capture pulse corresponding to P2 is generated. A ClockCode of 2 corresponds to a system clock divided by 2. Similarly, the output of logic circuit 96 is active only when the specified ClockCode is 1 and BurstLength is 2. This will cause a capture pulse corresponding to P1 to be generated when P1 becomes active. Otherwise, no capture pulse corresponding to P1 is generated, as can be seen from the CaptureClock waveform in Combination B in FIG. 9. This illustrates how a capture clock having half of the clock rate of the applied system clock can be derived.

In general, clock enable control signal generating circuit 74 generates one or more ClockEnable signals which control the state or mode, i.e. hold mode or capture mode, of source memory elements during capture operations. A ClockEnable signal is generated for each group of source memory elements having the same propagation delay. The propagation delay defines a predetermined maximum capture clock rate of source memory elements. For a source element, such as memory element 20, having an output with a propagation delay of two cycles, the predetermined maximum capture clock rate is one-half of the system clock. During a capture operation, circuit 74 configures in capture mode, throughout the capture operation, any source memory elements having a predetermined maximum capture clock rate which is the same as or higher than the clock rate of the capture clock generated by the clock generating circuit and configures in hold mode, during all but the last cycle of the capture clock and in capture mode for the last cycle, any source memory elements having a predetermined maximum capture clock rate which is lower than the clock rate of the capture clock. This allows a circuit to be tested at-speed and provides a mechanism for propagating the output of source memory elements to their respective destinations prior to the last capture cycle. Non-source memory elements are not affected by the ClockEnable signals. They are controlled by the ScanEnable signal and, accordingly, are configured in capture mode throughout the capture operation.

Figure 8:
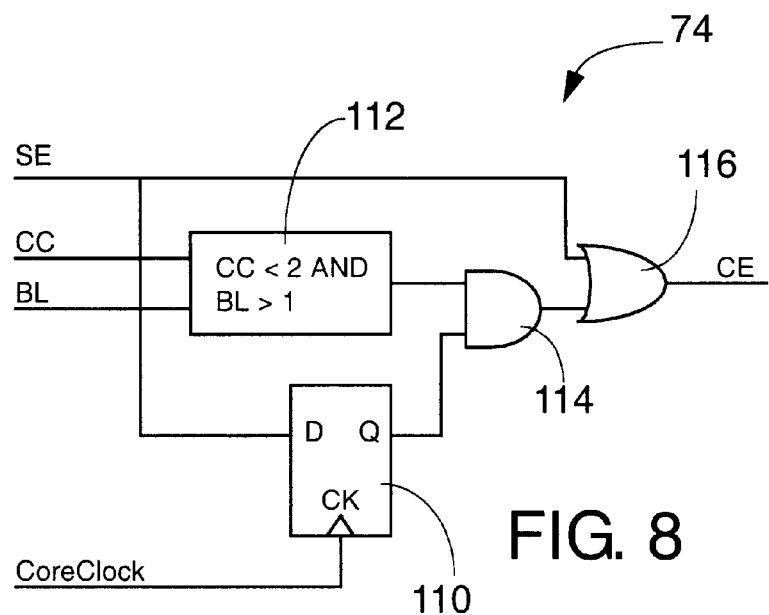
FIG. 8 illustrates a clock enable generation circuit which may be used in the circuit of FIG. 4, according to one embodiment of the present invention.

FIG. 8 illustrates an embodiment of a clock enable control signal generating circuit 74 for generating ClockEnable signal, CE, from ScanEnable, ClockCode and BurstLength. In general, depending on the values of ClockCode and BurstLength specified for the current test, circuit 74 operates to configure associated memory elements in capture mode throughout a capture operation when the capture clock rate is the same as or less than a predetermined rate or configure the associated memory elements in hold mode for all but the last cycle of the burst of capture clock cycles when the specified capture clock rate is greater than the predetermined rate.

The specific embodiment of the clock enable circuit illustrated is for use with the specific circuit illustrated in FIG. 1 and the type of memory element of FIG. 3. Other configurations of source memory elements may require slightly different circuits. Circuit 74 includes a shift register 110 for detecting the last cycle of the capture clock burst. For the simple circuit illustrated herein, the shift register simply comprises a single Flip-flop. Shift register 110 is clocked by CoreClock and receives the ScanEnable signal at its input D. In general, shift register 110 will include a number of shift register elements which is one less than the maximum propagation delay of the signal paths sourced by the source memory elements. This will ensure that under the appropriate circumstances, the associated source memory elements are configured in hold mode for all but the last cycle of the capture operation and in capture mode for the last cycle. A gating function circuit 112 receives the ClockCode and BurstLength signals, labeled CC and BL, respectively, at respective inputs. The inputs of an AND gate 114 are coupled to the outputs of flip-flop 110 and gating circuit 112. An OR gate 116 receives the ScanEnable signal and the output of AND gate 114.

It will be seen that ClockEnable is forced active whenever ScanEnable is active to allow the source memory elements to be configured in shift mode. During the capture clock burst, ScanEnable is inactive. Thus, the state of the source memory elements during the capture clock burst is dependent on the output of gating function circuit 112 and shift register 110. If ClockCode is 2 or more or if BurstLength is 1, the output of gating circuit 112 is inactive. Therefore, ClockEnable is forced inactive and the source memory element will be configured in capture mode for the entire duration of the capture clock burst. A BurstLength of 1 means that only one clock pulse will be generated during the capture operation.

On the other hand, if ClockCode is less than 2, i.e. 1, which means that the capture clock rate is equal to that of SystemClock, and BurstLength is greater than 1, then the output of circuit 112 is active and the ClockEnable control signal is forced active for all but the last cycle of the capture clock burst. The last cycle is indicated by a high value at the output of flip-flop 110. In the present example where BurstLength is 2, this will cause the source memory elements to be configured in hold mode for the first cycle of the capture clock burst and in a capture mode for the second and last cycle. Note that it is essential to have the clock input of flip-flop 110 connected to the CoreClock signal for correct synchronisation of the ClockEnable signal which is received by source memory elements which also receive the CoreClock signal at their clock input.

For a circuit that contains source memory elements with signal paths having a propagation delay of 2, 3, 4 or more clock cycles, several clock enable signals need to be generated by the test controller, one ClockEnable signal for each group of source memory elements with signal paths having same propagation delay. This is easily done by duplicating the circuit of FIG. 8 (flip-flop 110 can be shared) and modifying the gating logic 112 to accommodate the propagation delay of the multi-cycle path of associated source elements. For example, a clock enable signal CE3 (not shown) associated with source memory elements with signal paths requiring three clock cycles to propagate, would require the gating logic "CC<3 AND BL>1" which will generate an active output whenever ClockCode is less than 3 and the BurstLength is greater than 1. In general, a clock enable signal, CEi, associated with source memory elements with signal paths requiring i clock cycles to propagate, would require the gating logic: "CC<i AND BL>1".

Figure 9:
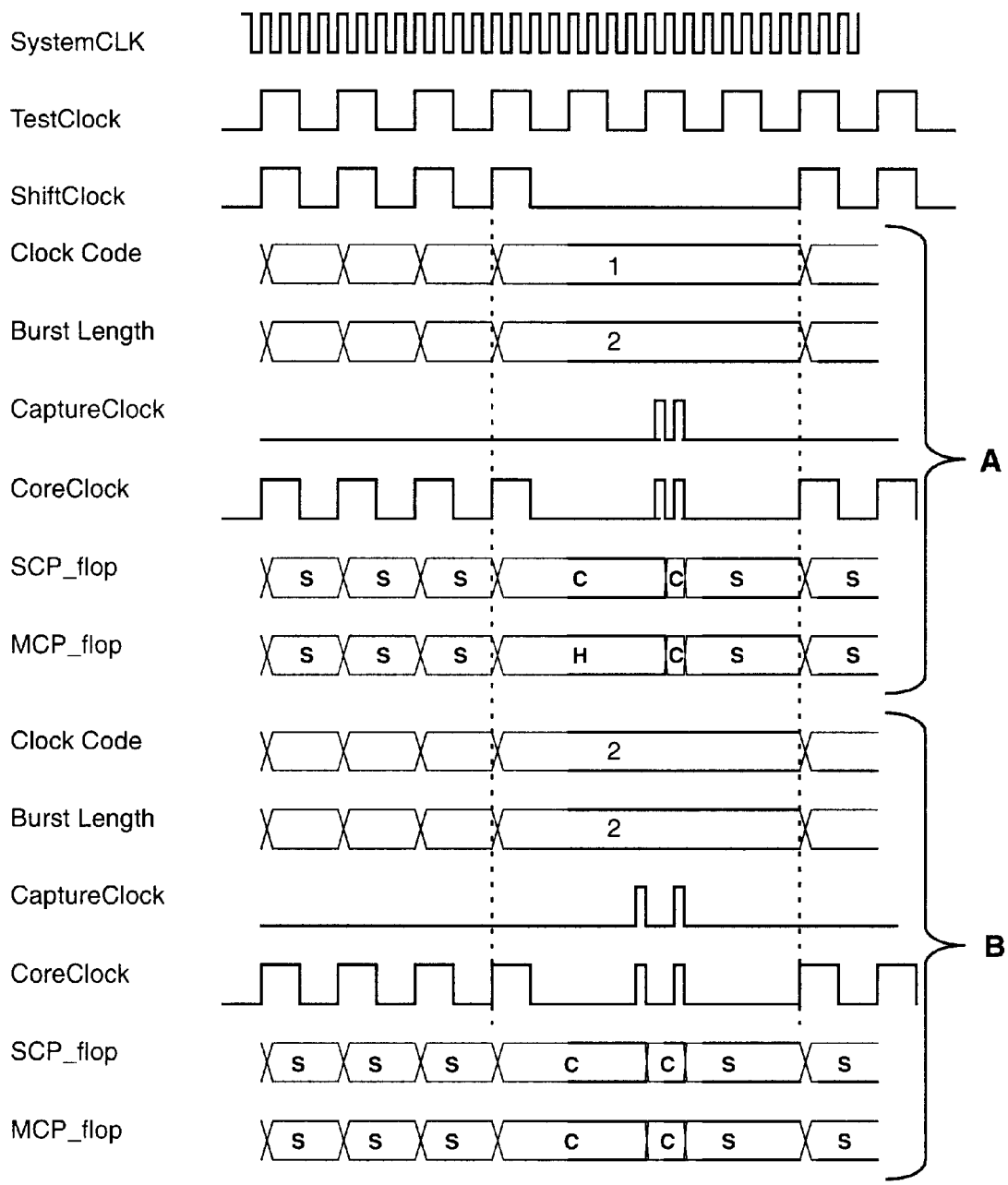
FIGS. 9 and 10 are timing diagrams illustrating the behavior of a circuit for different combinations of clock codes and burst lengths.

The timing diagram of FIG. 9 shows the relationship of the key signals in a circuit in which the clock rate of SystemClock is approximately eight times faster than the clock rate of TestClock. Both the system and test clocks are free-running. The clock rates do not need to be multiples of each other and they can be asynchronous to each other. The shift clock is derived from the test clock and is active during the shift mode indicated by an active scan enable signal. The capture clock is derived from the system clock and can only be active when the scan enable signal is inactive. The core clock applied to the clock input of the scannable memory elements, is simply the superposition of the shift clock and capture clock.

The values of ClockCode and BurstLength signals may be changed while data is scanned in and out of scannable memory elements. However, these signals should be stable during the time in which the capture clock is active to avoid making these signals timing critical.

Two combinations, A and B, of ClockCode and BurstLength are shown in FIG. 9. For combination A (CC=1 and BL=2), the capture clock consists of a burst of two consecutive system clock pulses corresponding to ClockCode 1. Signal SCP_flop and shows the configuration of memory elements (non-source memory elements) which are source of single cycle paths, i.e., which are not the source of multi-cycle paths. Signal MCP_flop shows the configuration of memory elements (source memory elements) which are the source of a multi-cycle path. Both types of memory elements are configured in a shift mode during the loading and unloading shift operations. At the end of the shift mode, non-source memory elements are configured in capture mode for the entire duration of the capture clock burst. However, source memory elements are configured in a hold mode for the first clock cycle of the capture clock burst and configured in a capture mode for the last clock cycle of the capture clock burst. This is necessary because a change at the output of source memory elements on two consecutive system clock cycles would cause other memory elements to capture an unpredictable value-a highly undesirable situation, especially when using built-in self-test. Keeping source memory elements in hold mode while clocking all other memory elements ensures that the output of the source memory has enough time to propagate to the inputs of recipient elements.

For combination A, all signal paths originating from non-source memory elements to other memory elements (both source and non-source) can be tested at system speed. For longer clock bursts, source memory elements are configured in hold mode for all but the last cycle of the capture clock burst and configured in capture mode for the last clock cycle of the capture clock burst.

For combination B of ClockCode and BurstLength (CC=2 AND BL=2), the capture clock consists of a burst of two non-consecutive system clock pulses which yield a capture clock rate which is half the system clock rate. In this case, all memory elements are configured in capture mode for all cycles of the capture clock burst. Using this combination, the multi-cycle paths sourced by source memory elements are tested at-speed. Paths originating at non-source memory elements are tested at half speed.

Figure 10:
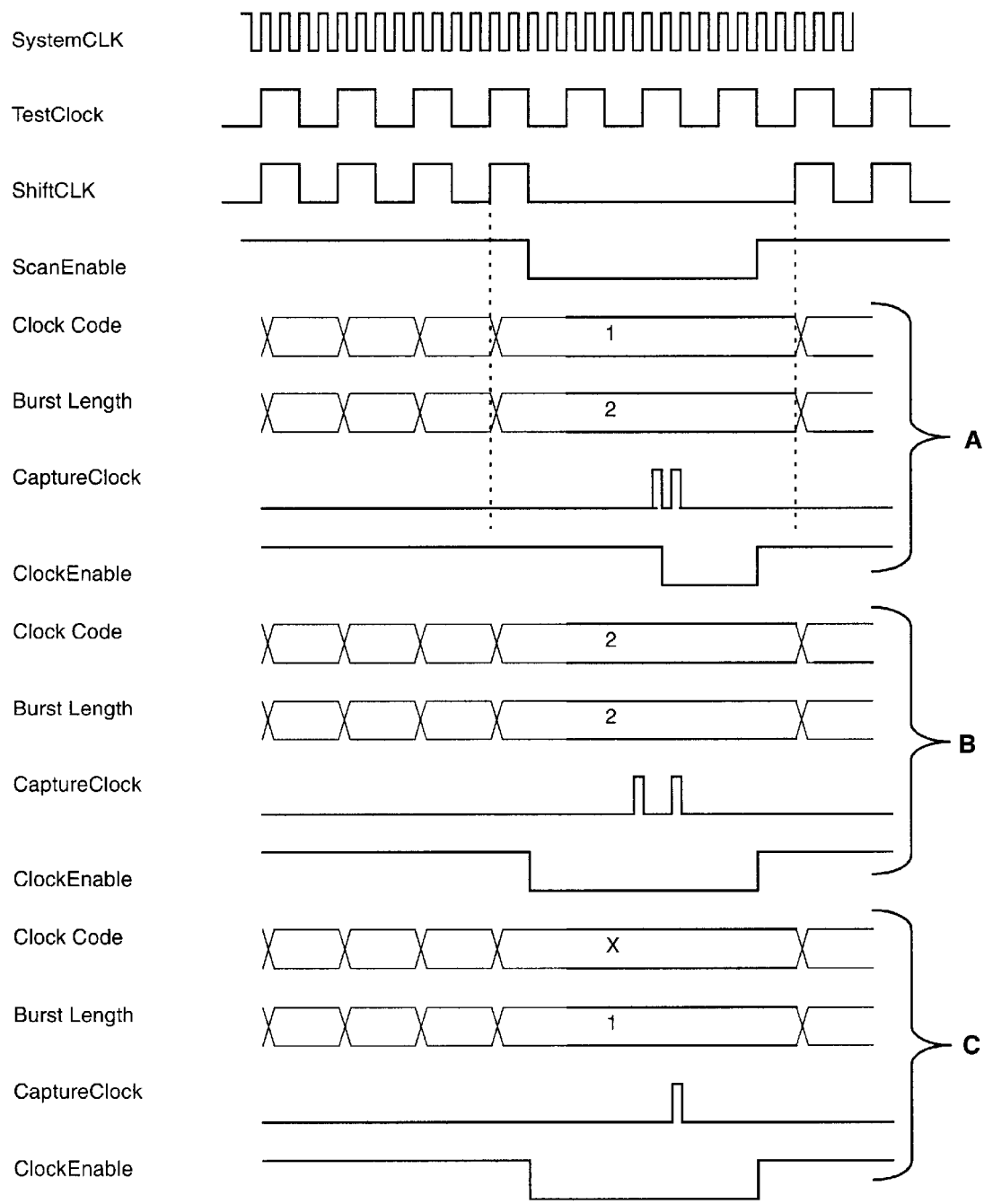

FIG. 10 is another timing diagram illustrating the specific ScanEnable and ClockEnable signals required to configure memory elements, of the type shown in FIG. 3, in the various modes (shift, capture, hold) for the same combinations A and B of ClockCode and BurstLength.

For combination A, source memory elements are configured in a hold mode by applying an inactive ScanEnable signal and an active ClockEnable signal. The capture mode requires an inactive ScanEnable signal and an inactive ClockEnable signal. Note that the only timing critical edge of these two control signals is the falling edge of the ClockEnable signal. Typically, relatively few memory elements are source memory elements. It is therefore relatively easy to design the proper circuitry to meet the timing specification of the ClockEnable signal.

For combination B, the source memory elements are configured in capture mode for all cycles of the capture clock burst by applying an inactive ScanEnable signal and an inactive ClockEnable signal. There are no timing critical control signals in this case.

Combination C illustrates the case where a BurstLength of 1 is used. The value of ClockCode is not important in this case. All memory elements are configured in capture mode. This combination is potentially useful for diagnostic purposes. None of the signal paths are tested at-speed using this combination.

Other features of this method is that the test clock can be an independent and asynchronous clock or derived from the system clock. The test can also be performed by using only the test clock in the case only one clock is available or for diagnostic and debug purposes.

Method OF Testing

It will be seen from the foregoing that the method, according to the present invention, for at-speed testing of a circuit having combinational logic and scannable memory elements connected to the combinational logic, one or more of the memory elements being a source of a multi-cycle signal path having a propagation delay that is longer than the period of a system clock applied to the elements during normal operation of the circuit, each source memory element having a predetermined maximum capture clock rate, corresponding to a minimum capture clock period, within which the output of a source element can traverse the signal path within one cycle of the capture clock, the scannable memory elements being configurable in shift mode and capture mode, the source memory elements being additionally configurable in hold mode, each of the scannable memory elements being clocked by a common clock signal, the method comprising:

loading a test stimulus into the scannable memory elements;

performing a capture operation including:

configuring in capture mode throughout the capture operation non-source memory elements and source memory elements having a predetermined maximum capture clock rate which is the same as or higher than the clock rate of a capture clock; and configuring in a hold mode during all but the last cycle of the capture clock and in capture mode for the last cycle thereof, source memory elements having a predetermined capture clock rate which is lower than the clock rate of the capture clock;

applying at least two clock cycles of the capture clock; and unloading test response data captured by the scannable memory elements.

The method further includes generating an active scan enable signal for configuring the memory elements in shift mode for performing test stimulus loading and response data unloading operations and an inactive scan enable signal for initiating and performing a capture operation. Prior to the capture operation, a clock code signal indicative of a predetermined capture clock rate and a capture clock burst length signal indicative of a number of capture clock cycles to be applied at the capture clock rate indicated by clock code signal are generated. The method includes responding to a transition of the scan enable signal from active to inactive by generating a sequence of capture clock pulses which depend on the values of the clock code signal and the clock burst length signal and generating a capture clock enable signal.

The state or mode of source memory elements during capture operations is controlled by gating the clock code and burst length signals to determine whether source memory elements are configured in hold mode or capture mode during all but the last of the clock cycles of the capture operation and by applying the scan enable signal to a shift register clocked by the common clock signal and whose length is such as to cause a source memory element to be to be configured in capture mode during the last cycle of the burst of capture clock cycles. Other features of the method will e apparent from the description of FIGS. 1–10.

Program Product

Figure 11:
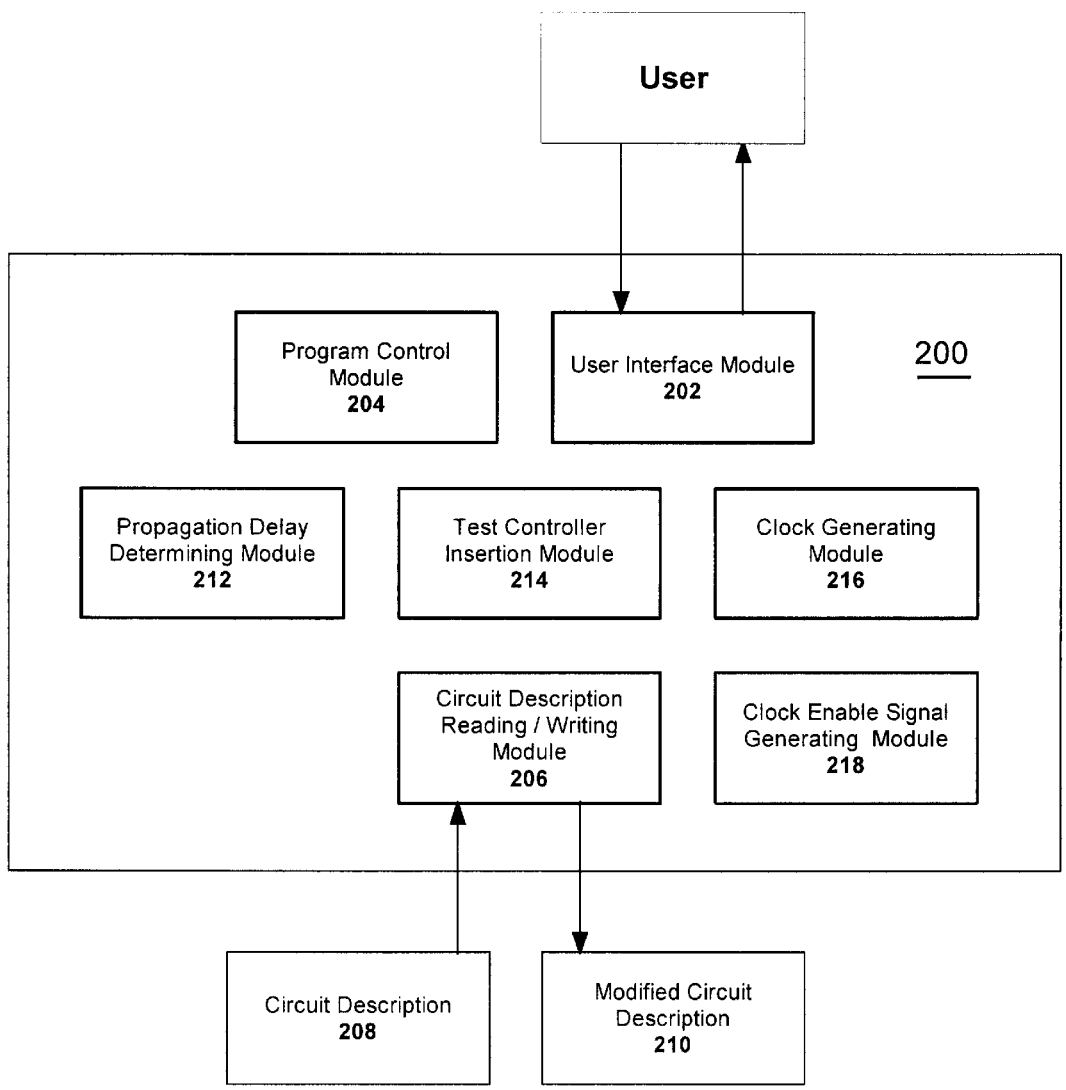
FIG. 11 is a block diagram of a program product for use in modifying a circuit description to incorporate scan testability therein according to the present invention.

In accordance with a further aspect, the present invention provides a program product for use in designing a circuit for at-speed testing, the circuit having combinational logic and scannable memory elements, including scannable memory elements having an output which is a source of a multi-cycle signal path having a propagation delay that is longer than the period of a system clock used during normal operation of the circuit, the scannable memory elements having a clock input used during both the functional mode of operation and a shift mode of operation. The program product, generally designated by reference numeral 200, is stored on a computer readable storage medium (not shown). FIG. 11 diagrammatically illustrates the major components of the program product. The program product includes a number of modules designed to perform specific tasks in accordance with the present invention. The program product includes an appropriate user interface module 202 to allow a user to invoke the program and specify various parameters including the name and location of a circuit description to be processed and the name and destination for a modified circuit description. A program control module 204 is responsive to the user interface module for implementing the above described method and procedures of the present invention and for calling or invoking the various modules. A circuit description reading/writing module 206 is operable to read a specified circuit description 208 and write out a modified circuit description 210 after after circuit modification has been completed.

A propagation delay determining module 212 determines the propagation delay of the output of each scannable memory element, and, when the propagation delay is greater than one cycle, arranges the scannable memory element in a multi-cycle path group of scannable memory elements having the same propagation delay, and substitutes the description of the scannable memory element with a description of a scannable memory element configurable in shift mode and in hold mode and capture mode under control of a ScanEnable and ClockEnable control signal.

A test controller module description insertion module 214 inserts into the circuit description 208, a description of a test controller for performing at-speed testing of the circuit. A clock generating circuit description insertion mode 216 inserts into circuit description 208 a description of a clock generating circuit for generating a common clock signal applied to the clock input of the memory elements during testing of the circuit, in which the circuit clock signal comprises a shift clock signal derived from a test clock signal and a capture clock signal derived from a system clock signal in which the number of cycles of the capture clock is determined from a combination of a burst length signal and a clock code signal.

A clock enable signal generating module 218 inserts into circuit description 208 a description of a clock enable signal generating circuit for generating a clock enable signal for each multi-cycle group of scannable memory elements including a gating function circuit responsive to a predetermined or specified clock code signal and burst length signal for configuring associated source memory elements in capture mode throughout a capture operation or in hold mode for all but the last of the clock cycles of the burst of capture clock cycles specified by the burst length signal, as previously explained.

Although the present invention has been described in detail with regard to preferred embodiments and drawings of the invention, it will be apparent to those skilled in the art that various adaptions, modifications and alterations may be accomplished with departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method for at-speed testing of a circuit having combinational logic and scannable memory elements connected to said combinational logic, one or more of said memory elements being a source of a multi-cycle signal path having a propagation delay that is longer than the period of a system clock applied to said elements during normal operation of said circuit, each source memory element having a predetermined maximum capture clock rate within which the output of a source element can traverse said signal path within one period of said capture clock, said scannable memory elements being configurable in shift mode and capture mode, said source memory elements being additionally configurable in hold mode, each said scannable memory elements being clocked by a common clock signal, said method comprising:
   loading a test stimulus into said scannable memory elements;
   performing a capture operation including:
      configuring in capture mode throughout said capture operation, non-source memory elements and source memory elements having a predetermined maximum capture clock rate which is the same as or higher than the clock rate of a capture clock; and
      configuring in a hold mode during all but the last cycle of said capture operation and in capture mode for the last cycle thereof, source memory elements having a predetermined maximum capture clock rate which is lower than the clock rate of said capture clock;
   applying at least two clock cycles of said capture clock; and
   unloading test response data captured by said scannable memory elements.

2. A method as defined in claim 1, further including, prior to said capture operation, generating a first signal indicative of a capture clock rate to be used during said capture operation.

3. A method as defined in claim 2, further including, prior to said capture operation, generating a second signal indicative of a predetermined number of capture clock cycles to be generated during said capture operation.

4. A method as defined in claim 1, further including, prior to said capture operation, generating a signal indicative of a predetermined number of capture clock cycles to be generated during said capture operation.

5. A method as defined in claim 1, further including deriving said capture clock from said system clock.

6. A method as defined in claim 1, further including performing said loading and unloading operations at a shift clock rate derived from a test clock having a clock rate which is less than that of said system clock.

7. A method as defined in claim 1, further including performing said loading and unloading operations under control of a shift clock derived from said system clock, said shift clock being the same or a divided-down version of said system clock.

8. A method as defined in claim 1, further including generating a source memory element control signal for each group of source memory elements having the same multi-cycle signal path propagation delay, said control signal being operable to configure said memory elements in hold mode or in capture mode during predetermined cycles of said capture operation.

9. A method as defined in claim 1, further including, following said loading operation, waiting for a predetermined amount of time prior to initiating said capture operation.

10. A method as defined in claim 1, further including, following said capture operation, waiting for a predetermined amount of time prior to initiating said unloading operation.

11. A method as defined in claim 1, further including:
   generating an active scan enable signal for configuring said memory elements in shift mode during said loading and unloading operations and an inactive scan enable signal for initiating a capture operation;
   prior to said capture operation, generating a clock code signal indicative of a predetermined capture clock rate;

prior to said capture operation, generating a capture clock burst length signal indicative of a number of capture clock cycles to be applied at the capture clock rate indicated by clock code signal; and responding to a transition of said scan enable signal from active to inactive by generating a sequence of capture clock pulses in which the number of said pulses depending on the values of a clock code signal indicative of a capture clock rate at which to perform said capture operation and a clock burst length signal indicative of said number of capture clock pulses to provide during said capture operation.

12. A method as defined in claim 11, each said waiting a predetermined amount of time including delaying detection of said transition of said scan enable signal.

13. A method as defined in claim 11, each said source memory element being configurable in shift mode and capture mode during capture operations in response to predetermined combinations of said scan enable signal and a clock enable signal, said method further including generating said clock enable signal, the state of which being dependent upon said scan enable signal, said clock code signal, said burst length signal and the clock signal applied to said memory elements.

14. A method as defined in claim 1, further including:
generating an active scan enable signal for configuring said memory elements in shift mode during said loading and unloading operations and an inactive scan enable signal for initiating a capture operation;
prior to said capture operation, generating a clock code signal indicative of a predetermined capture clock rate; and
responding to a transition of said scan enable signal from active to inactive by generating a predetermined number of capture clock pulses in which the number of said pulses depending on the values of said clock code signal indicative of a capture clock rate at which to perform said capture operation.

15. A method as defined in claim 1, further including generating an at-speed system clock and a test clock, deriving said shift clock from said test clock; and deriving said capture clock from said system clock.

16. A method as defined in claim 1, said capture clock including a burst of a predetermined number of clock cycles defined by a selected capture clock burst length.

17. A method as defined in claim 1, said capture clock rate corresponding to a predetermined clock code.

18. A method for at-speed testing of a circuit having combinational logic and scannable memory elements connected to said combinational logic, one or more of said memory elements being a source of a multi-cycle signal path having a propagation delay that is longer than the period of a system clock applied to said elements during normal operation of said circuit, each source memory element having a predetermined maximum capture clock rate within which the output of a source element can traverse said signal path within one period of said capture clock, said scannable memory elements being configurable in shift mode and capture mode, said source memory elements being additionally configurable in hold mode, each said scannable memory elements being clocked by a common clock signal, said method comprising:
for each group of source memory elements having the same propagation delay:
loading a test stimulus into said scannable memory elements under control of said common clock operating at a shift clock rate;
specifying a clock code representative of a capture clock rate;
performing a capture operation defined by burst of a predetermined number of capture clock cycles under control of said common clock operating at said capture clock rate, including:
configuring non-source memory elements in capture mode during said capture operation;
configuring source memory elements in a capture mode during said capture operation when the capture clock rate is the same as or lower than a predetermined maximum capture clock rate of said source memory elements;
configuring source memory elements in a hold mode during all but the last cycle of said capture operation and then configuring said source elements in capture mode for the last cycle of said capture operation when the capture clock rate is higher than a predetermined maximum capture clock rate of said source memory elements; and
applying said burst of a predetermined number of capture clock cycles to each said scannable memory elements, and
unloading test response data captured by said scannable memory elements under control of said shift clock.

19. A test controller for use in at-speed scan testing of a circuit having combinational logic and scannable memory elements including memory elements which source multi-cycle signal paths having propagation delays that are longer than the period of a system clock used during normal operation of said circuit, each source memory element having a predetermined maximum capture clock rate within which the output thereof can traverse said signal path within one period of said maximum capture clock rate, said scannable memory elements being configurable in shift mode and capture mode, said source memory elements being configurable in shift mode, capture mode and hold mode, said test controller comprising:
a clock generating circuit for generating a common clock signal for said scannable memory elements, said clock generating circuit providing:
a shift clock rate during test stimulus loading and test response unloading operations; and
a capture clock rate derived from a system clock during capture operations; and
a source memory element control circuit for:
configuring in capture mode throughout a capture operation, source memory elements having a predetermined maximum capture clock rate which is the same as or higher than the desired capture clock rate; and
configuring in a hold mode during all but the last cycle of said capture operation and in capture mode for the last cycle thereof, source memory elements having a predetermined capture clock rate which is lower than the desired capture clock rate.

20. A test controller as defined in claim 19, each said clock generating circuit and said source memory element control circuit being responsive to a clock code signal indicative of the capture clock rate at which to perform said capture operation and a burst length signal indicative of a burst of clock cycles to provide during said capture operation.

21. A test controller as defined in claim 19, each said clock generating circuit and said source memory element control circuit being responsive to a clock code signal indicative of the capture clock rate at which to perform said capture operation.

22. A test controller as defined in claim 19, each said clock generating circuit and said source memory element control circuit being responsive to a burst length signal indicative of a burst of clock cycles to provide during said capture operation.

23. A test controller as defined in claim 19, said clock generating circuit including:
   delay means for receiving a scan enable and producing a delayed scan enable signal;
   a transition detector for detecting transition of said delayed scan enable signal from active to inactive;
   a clock gating circuit operable under the control of a system clock signal and responsive to said transition detector for generating said capture clock signal;
   a shift clock generating circuit operable under the control of a test clock and responsive to an active scan enable signal for generating said shift clock; and
   means for superimposing said shift and capture clock signals to provide said common clock signal;
   said control circuit being operable under the control of said common clock signal.

24. A test controller as defined in claim 23, said clock gating circuit for controlling each cycle of said predetermined number of cycles, including:
   a shift register having a shift register element corresponding to each clock cycle of said number of clock cycles to be applied; and
   a gating function circuit associated with each said shift register element corresponding to each clock cycle for enabling or disabling an associated capture clock pulse, each said gating function being responsive to a clock code signal indicative of a capture clock rate to provide during a capture operation.

25. A test controller as defined in claim 24, said gating function circuit being further responsive to a burst length signal indicative of a number of capture clock cycles.

26. A test controller as defined in claim 23, said clock enable signal generating circuit including a clock enable signal generating circuit for each group of source memory elements having the same propagation delay, each said clock enable generating circuit providing a clock enable output signal connected to a clock enable input of each associated source memory element and being responsive to a scan enable signal, and including:
   a shift register clocked by said common clock signal and having a number of shift register elements corresponding to one less than a maximum burst length value and having an active output corresponding to the last clock cycle of a capture clock;
   a gating function circuit for producing an active output when an applied clock code signal is less than a predetermined clock cod associated with said group of source elements and an applied burst length signal is greater than one and otherwise producing an inactive output;
   first gate means for receiving the shift register output and the gating function output for producing an active output when said outputs are both active; and
   second gate means receiving a scan enable signal and the output of said first gate means for producing said clock enable signal.

27. A test controller as defined in claim 19, said clock enable signal generating circuit including a clock enable signal generating circuit for each group of source memory elements having an output signal paths with the same propagation delay, each said clock enable generating circuit providing a clock enable output signal connected to a clock enable input of each associated source memory element and being responsive to a scan enable signal, and including:
   a shift register clocked by said common clock signal and having a number of shift register elements corresponding to one less than a maximum burst length signal indicative of a number of capture clock cycles in said capture operation and having an active output corresponding to the last clock cycle of a capture clock;
   a gating function circuit for producing an active output when an applied clock code signal is less than a predetermined clock code associated with said group of source elements and an applied burst length signal is greater than one and otherwise producing an inactive output;
   first gate means for receiving the shift register output and the gating function output for producing an active output when said outputs are both active; and
   second gate means receiving a scan enable signal and the output of said first gate means for producing said clock enable signal.

28. A test controller as defined in claim 27, further including means responsive to a burst length signal indicative of a number of capture clock cycles to execute during a capture operation for selecting a number of said shift register elements corresponding to said number of capture clock cycles.

29. A circuit having combinational logic and scannable memory elements connected to said combinational logic, including at least one memory element which source multi-cycle signal paths having a propagation delay that is longer than the period of a system clock used during normal operation of said circuit, said scannable memory elements being configurable in shift mode and capture mode, said circuit comprising:
   each said source memory elements being configurable in shift mode, capture mode and hold mode;
   a test controller having:
      a clock generating circuit for generating a common clock signal for said scannable memory elements, said clock generating circuit providing a shift clock rate during test stimulus loading and test response unloading operations and a predetermined number of cycles at a system clock rate during capture operations in response to a first signal indicative of a predetermined capture clock rate; and
      a source memory element control circuit responsive to said first signal for configuring source memory elements in capture mode for all cycles of said predetermined number of clock cycles when said first signal corresponds to a capture clock rate which is the same or lower than a predetermined maximum capture clock rate; and configuring said source memory element in a hold mode for all cycles but the last cycle of said predetermined number of clock cycles and configuring said source memory element in a capture mode for the last clock cycle when said first signal corresponds to a capture clock rate which is higher than said predetermined maximum clock rate.

30. A circuit as defined in claim 29, each said clock generating circuit being further responsive to a second signal indicative of said predetermined number of clock cycles to perform during said capture operation.

31. A circuit as defined in claim 30, said test clock being derived from said system clock.

32. A circuit as defined in claim 30, said clock gating circuit for controlling each cycle of said predetermined number of cycles, including:
   a memory element corresponding to each clock cycle of said number of clock cycles to be applied; and
   a gating function circuit associated with each said memory element corresponding to each clock cycle for enabling or disabling an associated capture clock pulse, each said gating function being responsive to said first and second signals.

33. A circuit as defined in claim 29, said clock generating circuit including:
   a transition detector for detecting transitions of a scan enable signal;
   a clock gating circuit operable under the control of a system clock signal and responsive to said transition detector for generating said capture clock signal;
   a shift clock generating circuit operable under the control of a test clock and responsive to an active scan enable signal for generating said shift clock; and
   means for superimposing said shift and capture clock signals to provide said memory element clock signal;
   said control circuit being operable under the control of said memory element clock signal.

34. A circuit as defined in claim 29, said source memory elements being arranged in groups of source memory elements having the same multi-cycle signal path propagation delay, each said group being associated with a respective source memory element control circuit, said respective control circuit having a respective predetermined maximum capture clock rate.

35. A circuit as defined in claim 29, said control signal generating circuit having a gating function circuit for each said group.

36. A circuit as defined in claim 29, said test controller further including a finite state machine for generating test control signals, a pattern generator, a test response analyzer, chain counter and a vector counter.

37. A circuit as defined in claim 29, said clock enable signal generating circuit including a clock enable signal generating circuit for each group of source memory elements having an output signal path with the same propagation delay, each said clock enable generating circuit providing a clock enable output signal connected to a clock enable input of each associated source memory element and being responsive to a scan enable signal, and including:
   a shift register clocked by said common clock signal and having a number of shift register elements corresponding to one less than a maximum burst length value and having an active output corresponding to the last clock cycle of a capture clock;
   a gating function circuit for producing an active output when an applied clock code signal is less than the propagation delay of said group of source elements and an applied burst length signal is greater than one and otherwise producing an inactive signal;
   first gate means for receiving the shift register output and the gating function output for producing an active output when said outputs are both active; and
   second gate means receiving a scan enable signal and the output of said first gate means for producing said clock enable signal.

38. A method of designing a circuit for at-speed testing, the circuit having combinational logic and scannable memory elements, including scannable memory elements having an output which are a source of a multi-cycle signal paths having a propagation delay that is longer than the period of a system clock used during normal operation of said circuit, said scannable memory elements having a clock input used during both the functional mode of operation and a shift mode of operation, the method comprising:
   reading a circuit description of said circuit having a description of each scannable memory element;
   inspecting the description of each scannable memory element and:
      determining the maximum propagation delay of any path sourced by the output of said scannable memory element, and, when the propagation delay is greater than one cycle:
         arranging said scannable memory element in a multi-cycle path group of scannable memory elements having the same propagation delay; and
         revising said description of said scannable memory element by adding a hold mode defined by a control signal;
   inserting into said circuit description, a description of a test controller for performing at-speed testing of said circuit, including:
      a description of a clock generating circuit for generating a common clock signal applied to the clock input of said memory elements during testing of said circuit, in which said circuit clock signal comprises:
         shift clock signal derived from a test clock signal;
         a capture clock signal derived from a system clock signal in which the number of cycles of said capture clock is determined from a combination of a burst length signal and a clock code signal; and
      a description of a clock enable signal generating circuit for generating a distinct clock enable signal for each said multi-cycle group of scannable memory elements; and
   storing the revised description of said circuit.

39. A method as defined in claim 38, including determining a maximum capture clock rate allowed for the scannable memory elements in each said group; and selecting a clock code associated with a maximum capture clock rate allowed for the scannable memory elements in each said group.

40. A method as defined in claim 38, further including specifying a burst length signal indicative of a number of capture clock pulses to be applied during a capture operation to each said scannable memory elements to the maximum propagation delay determined in said determining the propagation delay.

41. A method as defined in claim 38, wherein said adding a hold mode including a description of a hold mode provided by a combination of a clock enable signal and a scan enable signal.

42. A method as defined in claim 41, said clock enable signal being associated with a maximum capture clock rate allowed for the scannable memory elements in each said group.

43. A method as defined in claim 42, further including associating said clock enable and scan enable signals with said clock and clock enable generation circuit.

44. A method as defined in claim 38, further including inserting a description of a delay circuit associated with a scan enable signal for generating a delayed scan enable signal.

45. A method as defined in claim 44, further including inserting a description of a transition detector for producing an output pulse when the delayed scan enable signal makes a transition from active to inactive.

46. A method as defined in claim 38, further including inserting a description of a latch which receives a capture clock enable signal at its data input and said system clock signal at its clock input and of an AND gate which receives the output of said latch and said test clock signal for generating a shift clock signal.

47. A method as defined in claim 38, further including inserting a description of a latch which receives the scan enable signal at its data input and said test clock signal at its clock input and of an AND gate which receives the output of said latch and said test clock signal for generating a shift clock signal.

48. A method as defined in claim 47, further including inserting a description of an OR gate for receiving the capture clock signal and the shift clock signal and generating said circuit clock signal.

49. A method as defined in claim 38, wherein the description of said clock generating circuit includes a description of a clock gating circuit having:
   a shift register clocked by the system clock and having a number of shift register elements corresponding to the product of one less than a maximum burst length value and a maximum clock code value;
   a gating function circuit associated with each of said shift register elements for enabling a capture pulse; and
   means coupling the output of each function circuit with the output of its associated shift register element for generating a capture clock pulse enable signal.

50. A method as defined in claim 49, each said gating function being responsive to a clock code corresponding to a system capture clock rate for enabling a corresponding capture pulse and otherwise disabling said corresponding capture pulse.

51. A method as defined in claim 38, said clock enabling circuit including inserting a description of a clock enable signal generating circuit for each group of source memory elements having the same propagation delay, each said clock enable generating circuit providing a clock enable output signal connected to a clock enable input of associated source memory elements and being responsive to a scan enable signal, and including:
   a shift register clocked by the capture clock and having a number of shift register elements corresponding to one less than a maximum burst length value and having an active output corresponding to the last clock cycle of said burst of capture clock cycles;
   a gating function circuit producing an active output when a clock code signal less than the propagation delay of said group of source elements and an applied burst length signal is greater than one and otherwise producing an inactive signal;
   first gate means for receiving the shift register output and the gating function output for producing an active output when said outputs are both active; and
   second gate means receiving a scan enable signal and the output of said first gate means for producing said clock enable signal.

52. A program product for use in designing a circuit for at-speed testing, the circuit having combinational logic and scannable memory elements, including scannable memory elements having an output which is a source of a multi-cycle signal path having a propagation delay that is longer than the period of a system clock used during normal operation of said circuit, said scannable memory elements having a clock input used during both the functional mode of operation and a shift mode of operation, the program product comprising:
   a computer readable storage medium;
   means recorded on the medium for reading a circuit description of said circuit having a description of each scannable memory element;
   means recorded on the medium for determining the maximum propagation delay of all signal paths sourced the output of each said scannable memory element, and, when the propagation delay is greater than one cycle:
      arranging said scannable memory element in a multi-cycle path group of scannable memory elements having the same propagation delay; and
      substituting the description of said scannable memory element which a description of a scannable memory element configurable in a hold mode under control of a control signal;
   means recorded on the medium for inserting into said circuit description, a description of a test controller for performing at-speed testing of said circuit, including:
      a description of a clock generating circuit for generating a circuit clock signal applied to the clock input of said memory elements during testing of said circuit, in which said circuit clock signal comprises:
         shift clock signal derived from a test clock signal;
         a capture clock signal derived from a system clock signal in which the number of cycles of said capture clock is determined from a combination of a burst length signal and a clock code signal; and
      a description of a clock enabling circuit for generating a distinct clock enable signal for each said multi-cycle group of scannable memory elements; and
   means recorded on the medium for storing a revised description of said circuit.

53. A program product as defined in claim 52, further including means recorded on said medium for determining a maximum capture clock rate allowed for the scannable memory elements in each said group; and selecting a clock code associated with a maximum capture clock rate allowed for the scannable memory elements in each said group.

54. A program product as defined in claim 52, further including means recorded on the medium for specifying a burst length signal indicative of a number of capture clock pulses to be applied during a capture operation to each said scannable memory elements to the maximum propagation delay determined in said determining the propagation delay.

55. A program product as defined in claim 52, wherein said substituting the description including a description of a hold mode provided by a combination of a clock enable signal and a scan enable signal.

56. A program product as defined in claim 55, said clock enable signal being associated with a maximum capture clock rate allowed for the scannable memory elements in each said group.

57. A program product as defined in claim 56, further including associating said clock enable and scan enable signals with said clock and clock enable generation circuit.

58. A program product as defined in claim 56, further including inserting a description of a delay circuit associated with a scan enable signal for generating a delayed scan enable signal.

59. A program product as defined in claim 58, further including inserting a description of a transition detector for producing an output pulse when the delayed scan enable signal makes a transition from active to inactive.

60. A program product as defined in claim 55, further including inserting a description of a latch which receives the scan enable signal at its data input and said test clock signal at its clock input and of an AND gate which receives the output of said latch and said test clock signal for generating a shift clock signal.

61. A program product as defined in claim 52, further including inserting a description of a latch which receives a capture clock enable signal at its data input and said system clock signal at its clock input and of an AND gate which receives the output of said latch and said test clock signal for generating a shift clock signal.

62. A program product as defined in claim 60, further including inserting a description of an OR gate for receiving the capture clock signal and the shift clock signal and generating said circuit clock signal.

63. A program product as defined in claim 52, wherein the description of said clock generating circuit includes a description of a clock gating circuit having:
- a shift register clocked by the system clock and having a number of shift register elements corresponding to the product of one less than a maximum burst length value and a maximum clock code value;
- a gating function circuit associated with each said group and an associated one of said shift register elements; and
- means coupling the output of each function circuit with the output of its associated shift register element for generating a capture clock pulse enable signal.

64. A program product as defined in claim 63, each said gating function being responsive to a clock code corresponding to a system capture clock rate for enabling a corresponding capture pulse and otherwise disabling said corresponding capture pulse.

65. A program product as defined in claim 52, said description of said clock enabling circuit including a description of a clock enable signal generating circuit for each group of source memory elements having the same propagation delay, each said clock enable generating circuit providing a clock enable output signal connected to a clock enable input of each associated source memory element and being responsive to a scan enable signal, and including:
- a shift register clocked by the capture clock and having a number of shift register elements corresponding to one less than a maximum burst length value and having an active output corresponding to the last clock cycle of a capture clock;
- a gating function circuit producing an active output when a clock code signal less than the propagation delay of said group of source elements and an applied burst length signal is greater than one and otherwise producing an inactive signal;
- first gate means for receiving the shift register output and the gating function output for producing an active output when said outputs are both active; and
- second gate means receiving a scan enable signal and the output of said first gate means for producing said clock enable signal.

* * * * *